(12) United States Patent
Lin

(10) Patent No.: US 8,064,199 B2
(45) Date of Patent: Nov. 22, 2011

(54) MEMORY COOLING FAN TRAY

(75) Inventor: Chuan-Hung Lin, Hsin Chuang (TW)

(73) Assignee: Akust Technology Co., Ltd., Taipei Hsien (TW)

( * ) Notice: Subject to any disclaimer, the term of this patent is extended or adjusted under 35 U.S.C. 154(b) by 0 days.

(21) Appl. No.: 12/194,285

(22) Filed: Aug. 19, 2008

(65) Prior Publication Data

US 2011/0228476 A1 Sep. 22, 2011

(30) Foreign Application Priority Data

Oct. 24, 2007 (TW) .............................. 96217811 U

(51) Int. Cl.
*H05K 7/20* (2006.01)
*G06F 1/20* (2006.01)

(52) U.S. Cl. .............. 361/695; 361/679.31; 361/679.48; 361/715; 361/720

(58) Field of Classification Search ............. 361/679.31–679.32, 679.48, 679.5, 361/694–695, 719–720; 165/80.3
See application file for complete search history.

(56) References Cited

U.S. PATENT DOCUMENTS

| | | | | |
|---|---|---|---|---|
| 5,871,396 A * | 2/1999 | Shen | ............................... | 454/184 |
| 6,130,820 A * | 10/2000 | Konstad et al. | ............... | 361/695 |
| 6,775,139 B2 * | 8/2004 | Hsueh | ........................... | 361/697 |
| RE39,784 E * | 8/2007 | Hsueh | ........................... | 361/697 |
| 7,471,514 B2 * | 12/2008 | Chen | ............................. | 361/695 |
| 7,580,259 B2 * | 8/2009 | Hsiao | ............................ | 361/695 |
| 7,738,252 B2 * | 6/2010 | Schuette et al. | .............. | 361/704 |
| 7,782,614 B2 * | 8/2010 | Li et al. | ......................... | 361/695 |
| 7,821,788 B2 * | 10/2010 | Hsiao | ............................ | 361/695 |
| 2006/0012956 A1 * | 1/2006 | Hornung et al. | .............. | 361/695 |
| 2007/0159789 A1 * | 7/2007 | Schuette et al. | .............. | 361/687 |
| 2009/0310295 A1 * | 12/2009 | Chou et al. | ............... | 361/679.48 |
| 2010/0296240 A1 * | 11/2010 | Schuette et al. | ......... | 361/679.54 |

FOREIGN PATENT DOCUMENTS

| | | | |
|---|---|---|---|
| JP | 2004-014957 A | * | 1/2004 |
| TW | M247906 | * | 10/2004 |
| TW | M265698 | * | 5/2005 |
| TW | M2653549 | * | 5/2005 |

* cited by examiner

*Primary Examiner* — Robert J Hoffberg
(74) *Attorney, Agent, or Firm* — Muncy, Geissler, Olds & Lowe, PLLC

(57) ABSTRACT

A memory cooling fan tray is composed of a bracket and a plurality of fans. The bracket is formed respectively with a plurality of abutting members, insertion members, and pivoting members. An interior of the bracket is formed with notch members, with a quantity corresponding to the number of fans. After the fans are loosely pivoted at the pivoting members, the fans can rotate freely on the bracket. Upon using, the bracket is inserted into a memory socket, and the fans are electrically connected with a power supply. Blow angles of the fans are adjusted by turning over the fans to change wind directions, so as to actively dissipate heat from the memory.

5 Claims, 6 Drawing Sheets

MEMORY COOLING FAN TRAY

BACKGROUND OF THE INVENTION a) Field of the Invention

The present invention relates to a cooling fan tray used for a purpose of cooling a memory, and more particularly to a memory cooling fan tray which is assembled into a memory socket and uses a feature that fans can be turned over with respect to a bracket for adjustment, to change blow angles.

b) Description of the Prior Art

As a clock speed of a computer is getting quicker and quicker, in addition to a central processing unit, other internal parts, such as memories, display cards, and hard disks, are speeded up correspondingly. As a result, heat generated will be higher and higher. However, there are a lot of places inside a computer case where a cooling flow is unable to reach, which are called hot spots or the locations where the heat is accumulated; especially for a narrow space between the memories, the heat cannot be dissipated successfully, and hence there will be an unstable phenomenon under a long term of usage.

Referring to FIG. 1, it shows a schematic view of a conventional cooling shield structure, wherein a plurality of clamp units 10 are used to attach two cooling shields 20 onto two surfaces of a memory 30, respectively. As a primary heat source of the memory 30 is chips 301 on its surface, the cooling shields 20 are made by a material which is easy to conduct heat, and heat generated from the chips 301 of the memory 30 will be conducted to the cooling shields 20 that are provided with larger areas, thereby dissipating the heat released from the memory 30 by using a merit of large heat dissipation area. However, this passive cooling method is not provided with a good effect. As a space between the memories 30 is very narrow, even that the heat is conducted to the surfaces of the cooling shields 20, the hot spots can be still formed due to that the cooling flow does not pass through these surfaces; therefore, an improvement is needed.

SUMMARY OF THE INVENTION

The primary object of the present invention is to provide an active memory cooling fan tray, which can quickly dissipate heat generated from the memory, thereby being provided with a better cooling efficiency.

Accordingly, the memory cooling fan tray of the present invention is constituted by a bracket and a plurality of fans. A bottom rim of the bracket is formed with a plurality of insertion members and a plurality of abutting members, and a top rim of the bracket is formed with a plurality of pivoting members from which are formed correspondingly with a plurality of notch members toward an interior of the bracket. After the fans have been loosely pivoted at the pivoting members, the fans can be turned over and placed at the notch members, or be turned outward to form certain angles for use. On the other hand, left and right end rims of the bracket are formed respectively with a locking hole, and upon using the memory cooling fan tray, the bracket is assembled on an empty memory socket and is tightly locked by using locking tools which lock the memory, to lock into the locking holes of the bracket. Next, the fans are electrically connected with a power supply, and wind directions can be changed through blow angles formed by turning over and adjusting the fans, to actively dissipate the heat of the memory. Accordingly, the heat in a slit between two neighboring memories, or the heat close to the memory, can all be dissipated quickly, thereby increasing a cooling efficiency in an interior of an original computer case, and preventing from generating hot spots in the case.

To enable a further understanding of the said objectives and the technological methods of the invention herein, the brief description of the drawings below is followed by the detailed description of the preferred embodiments.

DETAILED DESCRIPTION OF THE PREFERRED EMBODIMENTS

Figure 1:
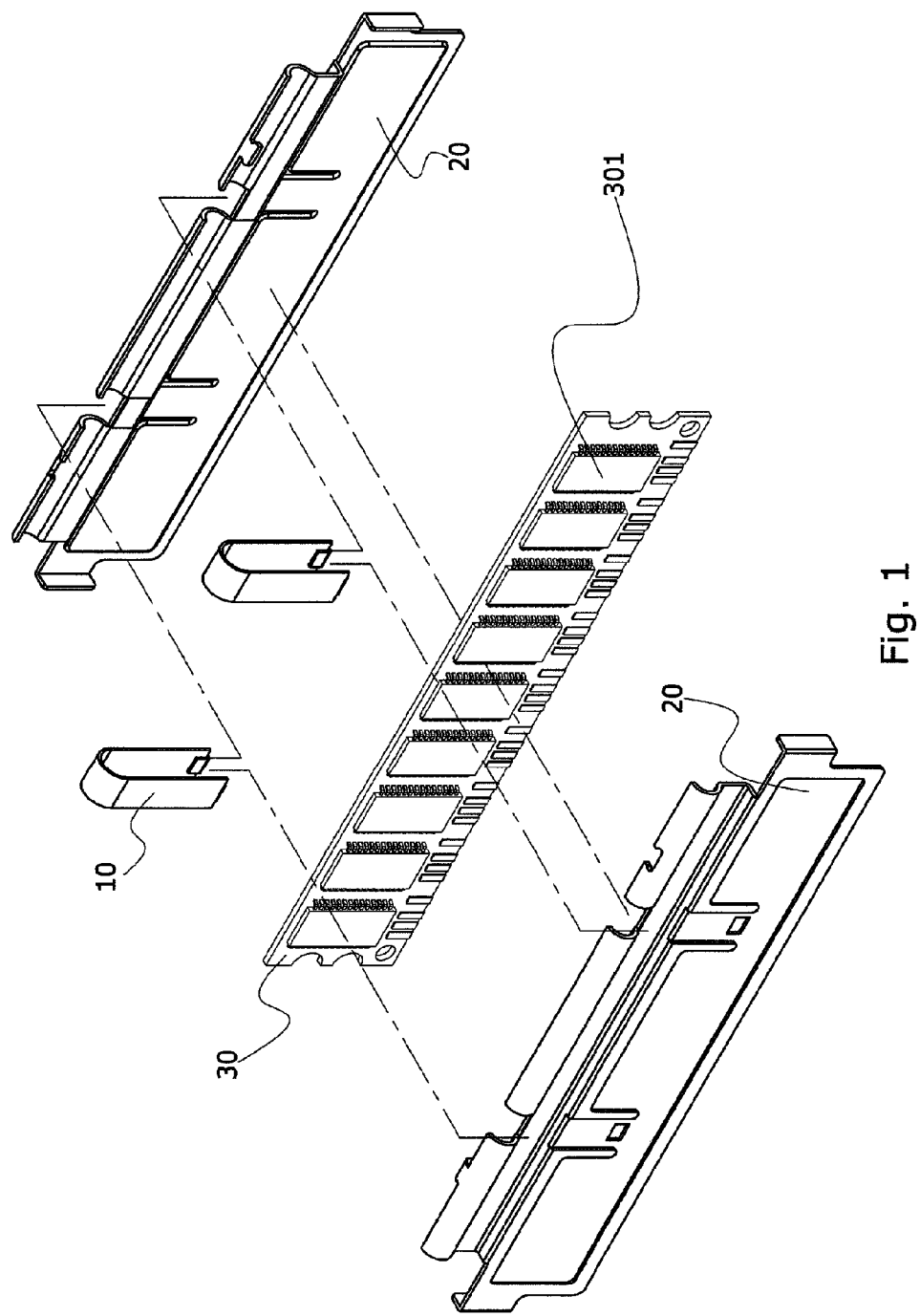
FIG. 1 shows a schematic view of a conventional cooling shield structure.
Figure 2:
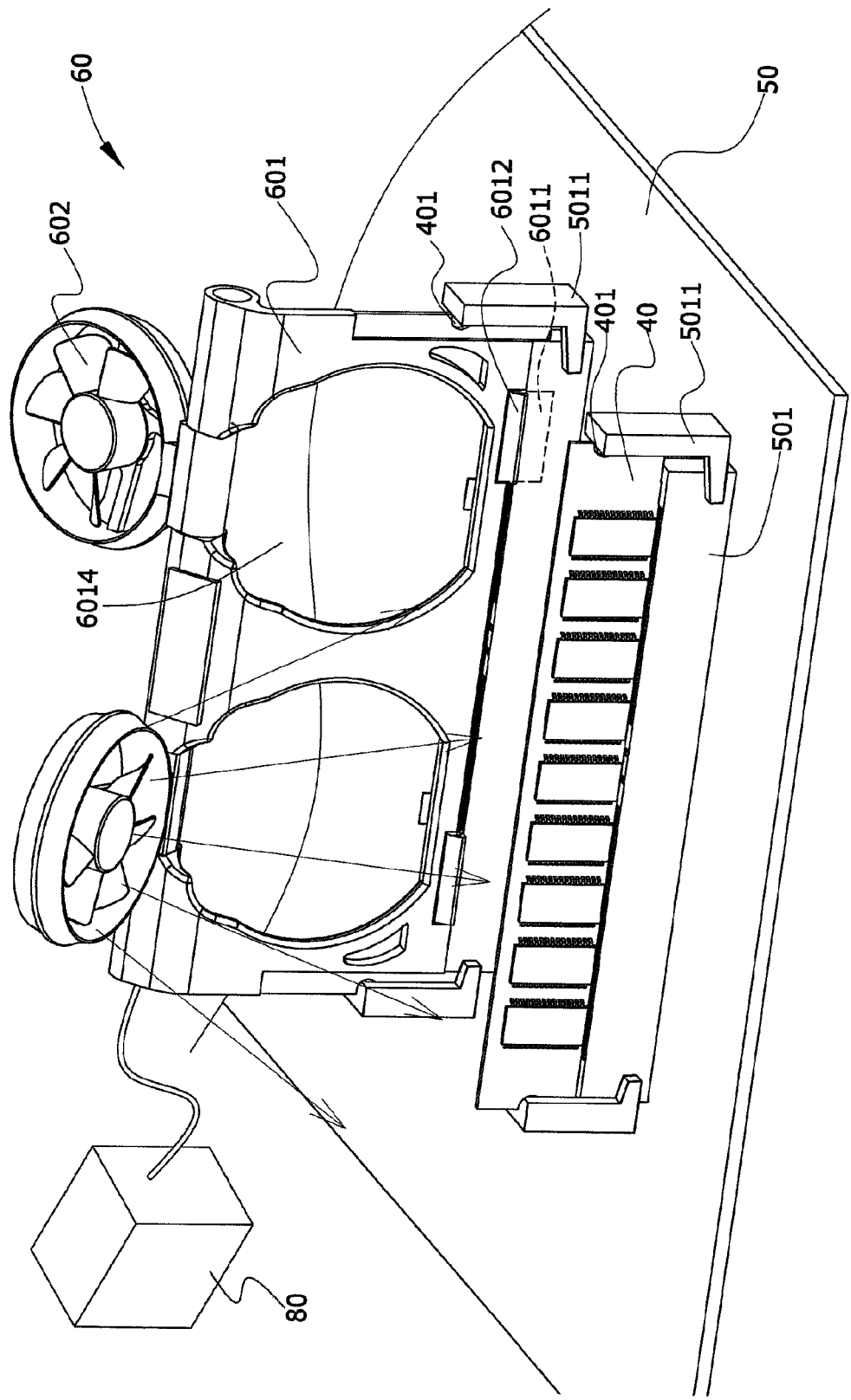
FIG. 2 shows a schematic view of a usage of a preferred embodiment of the present invention.

Referring to FIG. 2, it shows a schematic view of a usage of a preferred embodiment of the present invention, wherein an ordinary memory 40 is inserted into a memory socket 501 of a mainboard 50, with the memory socket 501 mostly a parallel design and its two ends being provided respectively with a locking tool 5011 to fasten with locking holes 401 on the memory 40. A memory cooling fan tray 60 of the present invention, whereas, includes primarily a bracket 601 and a plurality of fans 602. A bottom rim of the bracket 601 is formed with a plurality of insertion members 6011 and a plurality of abutting members 6012, a shape and a size of each insertion member 6011 are corresponding to those of the memory socket 501, in order to be assembled on the memory socket 501, and the abutting members 6012 formed on the bracket 601 are abutted on a top rim of the memory socket 501 when inserting the bracket 601, to increase a stability of the bracket 601 after accomplishing installation. An interior of the bracket 601 is pivoted with a plurality of fans 602, and angles of the fans 602 are adjustable, such that the fans 602 can be turned over and placed at notch members 6014, or be turned outward to form certain angles, for use. Upon using, the bracket 601 is crossed over an empty memory socket 501, and is tightly locked by using the locking tools 5011 which lock the memory unit 40, and then, the fans 602 are electrically connected with a power supply 80, enabling the fans 602 to operate normally (can suck or blow wind). The angles of the fans 602 of the present invention can be adjusted with respect to the bracket 601, to change wind directions, so as to blow the wind into each slit of the mainboard 50. Accordingly, heat in a slit between two neighboring memory units 40, or heat close to the memory unit 40, can all be actively and quickly dissipated, thereby increasing a cooling efficiency in an interior of an original computer case and preventing from generating hot spots in the case to cause an unstable operation of the computer system.

Figure 3:
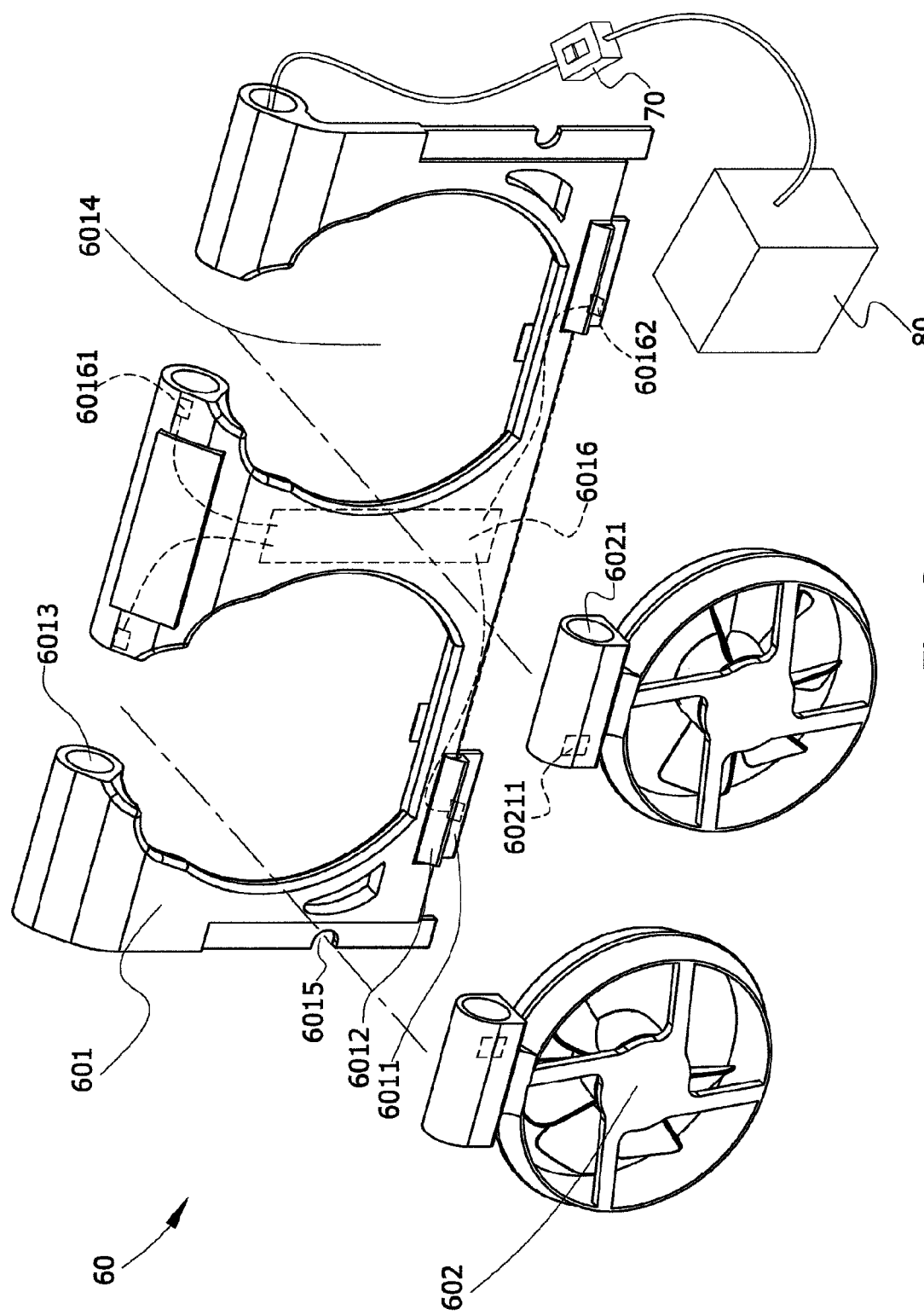
FIG. 3 shows a schematic view of a structure of a preferred embodiment of the present invention.

Referring to FIG. 3, it shows a structure of a preferred embodiment of the present invention, wherein in order to facilitate assembling on the aforementioned memory socket 501 and to adjust the wind angles, a memory cooling fan tray 60 comprises primarily a bracket 601, a bottom rim of which is formed with a plurality of insertion members 6011 and a plurality of abutting members 6012 that are corresponding to a size of a memory socket 501 (as shown in FIG. 2) for inserting into the memory socket 501 and allowing the bracket 601 to be tightly and stably assembled on the memory socket 501, and a top rim of which is formed with a plurality of pivoting members 6013, with a plurality of notch members 6014 being formed from the pivoting members 6013 toward an interior of the bracket 601, and a locking hole 6015 being formed respectively at left and right ends of the bracket 601 for tightly locking with the aforementioned locking tools 5011 that lock the memory 40 (as shown in FIG. 2); and a plurality of fans 602, which can be the normal square fans 602 or round fans 602, with an end of each fan 602 being formed with an opposite pivoting member 6021 for loosely pivoting the fan 602 at the pivoting member 6013, and for emplacing the fan 602 into the notch member 6014 of the bracket 601. Upon using, the fans 602 are electrically connected with a toggle switch 70, and then are electrically connected with a power supply 80 to toggle an on-off state of the fans 602, or to control the fans 602 to rotate clockwise or counterclockwise. In the present invention, when the fans 602 are loosely pivoted at the pivoting members 6013 of the bracket 601, they can rotate with the pivoting members 6013 as pivot points, and after the fans 602 have been turned over with respect to the bracket 601, directions of wind access of the fans 602 can be changed. Moreover, the fans 602 can be electrically connected with an external power supply 80 for use, or can directly access electricity from the memory socket 501 when the bracket 601 is inserted into the aforementioned memory socket 501. Therefore, an end of the fan 602 that is corresponding to the pivoting member 6013 is formed with a first junction 60211, and an interior of the bracket 601 is assembled with a power circuit 6016 which is formed respectively with a first opposite junction 60161 on the pivoting member 6013 and a second junction 60162 on the insertion member 6011, to facilitate connecting the electricity in the memory socket 501.

Figure 4:
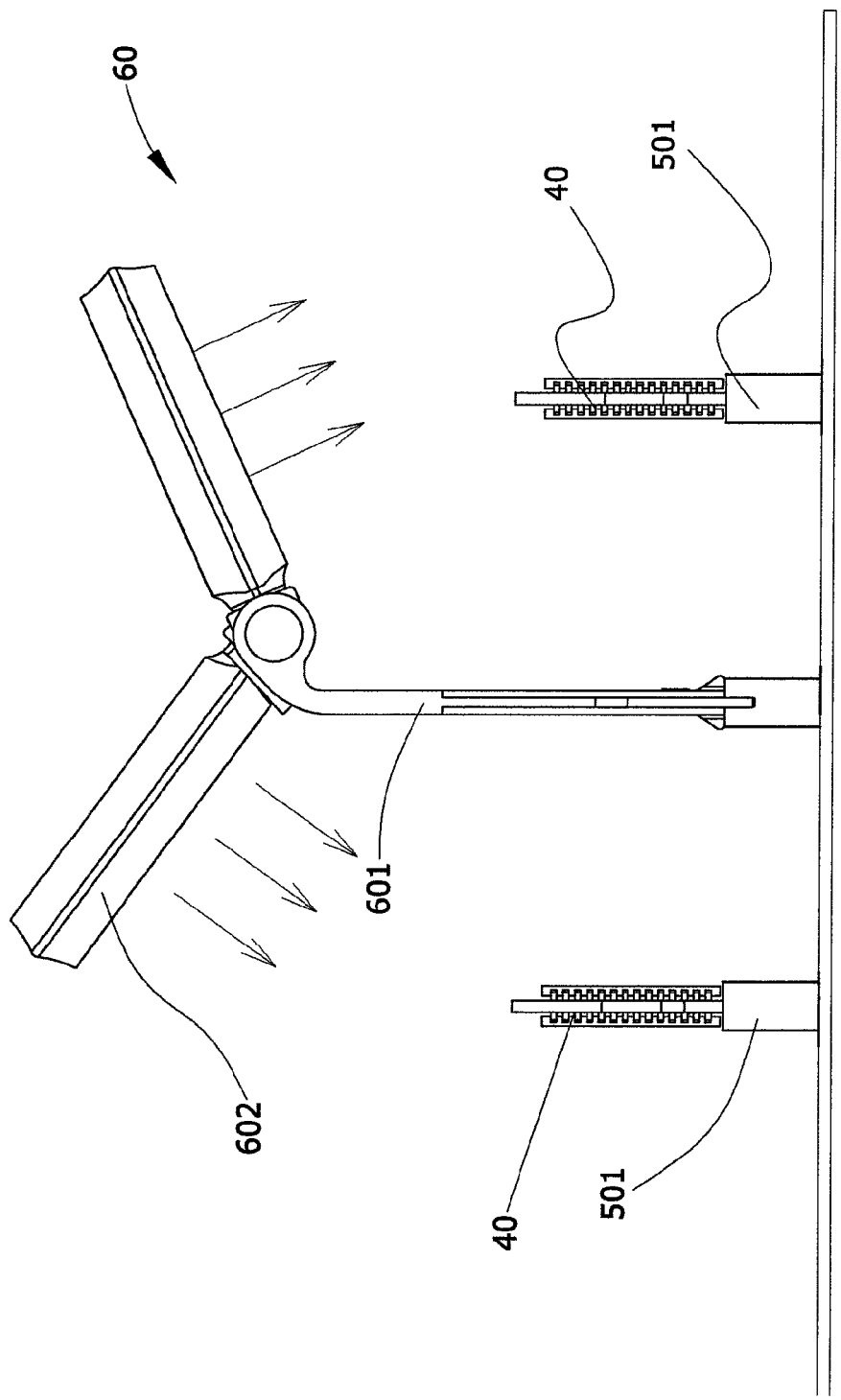
FIG. 4 shows a first schematic view of an adjustment of a preferred embodiment of the present invention.
Figure 5:
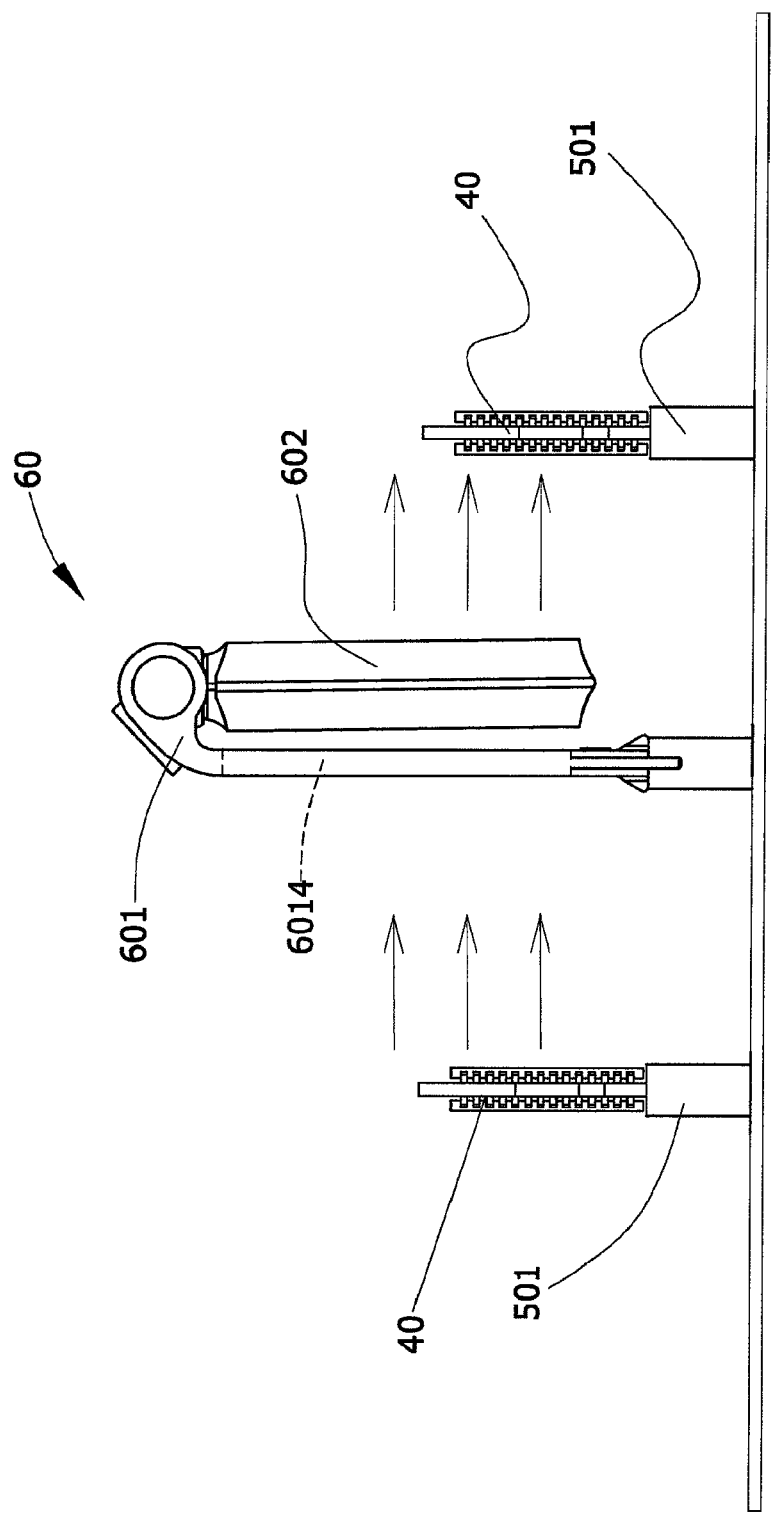
FIG. 5 shows a second schematic view of an adjustment of a preferred embodiment of the present invention.

Referring to FIG. 4, it shows a first schematic view of an adjustment of a preferred embodiment of the present invention, wherein the bracket 601 of the memory cooling fan tray 60 of the present invention is assembled on an empty memory socket 501, and the memory sockets 501 at two sides of this memory socket 501 are further inserted with a memory 40, respectively. Upon using, the plural fans 602 can be turned over toward two sides of the bracket 601 respectively, and be adjusted to optimal angles, such that the wind from the fans 602 can directly blow toward the memories 40 and can dissipate heat accumulated between the memory sockets 501, thereby providing a rather convenient utilization and a better cooling efficiency. Furthermore, referring to FIG. 5, it shows a second schematic view of an adjustment of a preferred embodiment of the present invention. First of all, the fans 602 are collected and emplaced in the notch members 6014 inside the bracket 601, and then the bracket 601 of the memory cooling fan tray 60 is assembled on an empty memory socket 501; whereas, the memory sockets 501 at two sides of this memory socket 501 are further inserted with a memory 40, respectively. Upon using, the fans 601 directly blow toward the memories 40, to directly dissipate heat on surfaces of the memories 40, and to dissipate heat accumulated between the memory sockets 501, thereby providing a rather convenient utilization and a better cooling efficiency.

Figure 6:
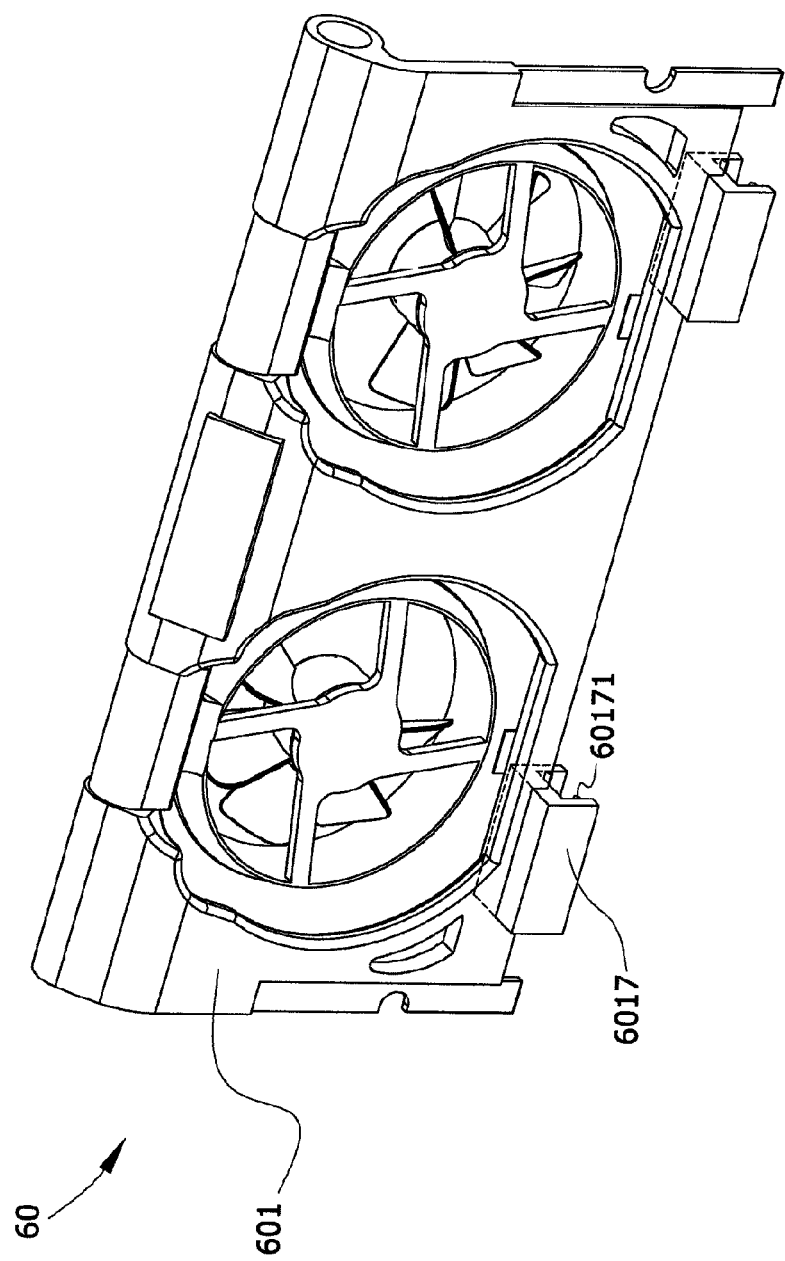
FIG. 6 shows a schematic view of a structure of another preferred embodiment of the present invention.

Referring to FIG. 6, it shows a structure of another embodiment of the present invention, wherein, to further increase convenience in installing the aforementioned memory cooling fan tray 60, a bottom rim of the bracket 601 is formed with a plurality of cross-over members 6017 to replace all the aforementioned insertion members 6011 and abutting members 6012, and an inner side of each cross-over member 6017 is formed with a locking member 60171. Upon installing to the aforementioned memory socket 501, the bracket 601 is crossed over a top rim of the memory socket 501, and is tightly locked at two sides of the memory socket 501 by the locking members 60171. Finally, the bracket 601 is tightly locked and stably fixed on the memory socket 501 by using the aforementioned locking tools 5011 that lock the memory 40.

Accordingly, upon implementing the present invention, the bracket is inserted into the memory socket, and is then locked by using the locking tools that lock the memory, allowing the bracket to be stably fixed into the memory socket. As the fans are loosely pivoted at the pivoting members at the peripheries of the notch members, the fans can rotate by large angles on the bracket, to adjust the wind directions of the fans, so as to quickly dissipate the heat close to the memory socket, thereby accurately achieving an object for providing an active memory cooling fan tray to quickly dissipate the heat generated from the memory for reaching a better cooling efficiency.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A memory cooling fan tray, being assembled on a memory socket to adjust angles of wind directions, comprising:
   a bracket, a bottom rim of the bracket is formed respectively with a plurality of insertion members and a plurality of abutting members, a top rim of the bracket is formed with a plurality of pivoting members, with a plurality of notch members being formed from the plurality of pivoting members toward an interior of the bracket, and a plurality of locking holes, each of the plurality of locking holes being formed respectively at two sides of the bracket; and
   a plurality of fans which are loosely pivoted at the plurality of pivoting members, allowing the plurality of fans to be turned over or turned to any angle;
   wherein upon using, the plurality of fans being electrically connected with an external power supply, the plurality of insertion members of the bracket being inserted into the memory socket, the plurality of abutting members being abutted on a top portion of the memory socket, and locking tools that are formed respectively at two sides of the memory socket locking respectively into the plurality of locking holes at two sides of the bracket, so as to stably lock the bracket into the memory socket.

2. The memory cooling fan tray according to claim 1, wherein an end of each fan of the plurality of fans is formed with an opposite pivoting member of the plurality of pivoting holes to loosely pivot the each fan at each of the plurality of pivoting members, and to emplace the each fan into each of the plurality of notch members.

3. The memory cooling fan tray according to claim 1, wherein the plurality of fans are electrically connected with a toggle switch and then are electrically connected with the external power supply.

4. The memory cooling fan tray according to claim 1, wherein the plurality of fans further access electricity for use from the memory socket.

5. The memory cooling fan tray according to claim 4, wherein an end of the fan of the plurality of fans that is corresponding to each of the plurality of pivoting member is formed with a first junction, and an interior of the bracket is assembled with a power circuit which is formed respectively with a first opposite junction on the each of the plurality of pivoting members and a second junction on each of the plurality of insertion members, to facilitate connecting the electricity from the memory socket to the plurality of fans.

\* \* \* \* \*